(12) United States Patent
Katrak

(10) Patent No.: US 11,193,968 B2
(45) Date of Patent: Dec. 7, 2021

(54) DIAGNOSTIC SYSTEM FOR A VEHICLE ELECTRICAL SYSTEM HAVING FIRST AND SECOND VOLTAGE REGULATORS

(71) Applicant: LG Chem, Ltd., Seoul (KR)

(72) Inventor: Kerfegar K. Katrak, Fenton, MI (US)

(73) Assignee: LG Chem, Ltd., Seoul (KR)

( * ) Notice: Subject to any disclaimer, the term of this patent is extended or adjusted under 35 U.S.C. 154(b) by 648 days.

(21) Appl. No.: 16/044,671

(22) Filed: Jul. 25, 2018

(65) Prior Publication Data

US 2019/0033359 A1    Jan. 31, 2019

Related U.S. Application Data

(60) Provisional application No. 62/539,031, filed on Jul. 31, 2017.

(51) Int. Cl.
*G01R 31/00* (2006.01)
*G01R 31/28* (2006.01)
*G01R 31/36* (2020.01)
*G01R 31/3842* (2019.01)
*H03M 1/10* (2006.01)

(52) U.S. Cl.
CPC ........... *G01R 31/007* (2013.01); *G01R 31/28* (2013.01); *G01R 31/3648* (2013.01); *G01R 31/3842* (2019.01); *H03M 1/1071* (2013.01)

(58) Field of Classification Search
CPC .... G01R 21/005; G01R 21/006; G01R 21/10; G01R 31/50; G01R 31/343; G01R 31/007; G01R 31/006; G01R 31/3648; G01R 31/28; G01R 31/3842; G01R 31/388; H02M 1/32; H02P 29/0241; H03M 1/1071; H03M 1/124

See application file for complete search history.

(56) References Cited

U.S. PATENT DOCUMENTS 5,789,827 A * 8/1998 Rowley .................... B60Q 5/00
                                                          307/9.1
9,270,157 B2 * 2/2016 Kondou .................. H02M 1/08
(Continued)

OTHER PUBLICATIONS

U.S. Appl. No. 16/014,422, filed Jun. 21, 2018 entitled Diagnostic System for a Vehicle Electrical System.
(Continued)

*Primary Examiner* — Natalie Huls
*Assistant Examiner* — Man O Kung
(74) *Attorney, Agent, or Firm* — Buckert Patent & Trademark Law Firm PC; John F. Buckert

(57) ABSTRACT

A diagnostic system for a vehicle electrical system having first and second voltage regulators outputting first and second voltages, respectively, is provided. The diagnostic system includes a microcontroller having an analog-to-digital converter, a first application, and a first diagnostic handler application. The first application sets a first analog-to-digital converter status flag equal to a first fault value when a difference between a first corrected voltage value and a second corrected voltage value is greater than a threshold difference value indicating that the analog-to-digital converter is malfunctioning. The first diagnostic handler application commanding a digital input-output device to generate control signals if the first analog-to-digital converter status flag is equal to the first fault value.

12 Claims, 7 Drawing Sheets

(56) References Cited

U.S. PATENT DOCUMENTS

| | | | |
|---|---|---|---|
| 10,605,846 B2* | 3/2020 | Katrak | G06F 1/30 |
| 2004/0263180 A1* | 12/2004 | Rogers | F16H 61/12 |
| | | | 324/522 |
| 2011/0018340 A1* | 1/2011 | Patterson | H02J 7/1438 |
| | | | 307/10.1 |
| 2013/0009464 A1* | 1/2013 | Firehammer | H01M 10/48 |
| | | | 307/9.1 |
| 2014/0001833 A1* | 1/2014 | Grupido | B60L 50/51 |
| | | | 307/9.1 |

OTHER PUBLICATIONS

U.S. Appl. No. 16/038,331, filed Jul. 18, 2018 entitled Diagnostic System for a Vehicle Electrical System Having a Voltage Regulator.

* cited by examiner

| FLAG NAME | NON-FAULT VALUE (HEXADECIMAL) | FAULT VALUE (HEXADECIMAL) | |
|---|---|---|---|
| FIRST ANALOG-TO-DIGITAL CONVERTER STATUS FLAG | 6C | C6 | 601 |
| SECOND ANALOG-TO-DIGITAL CONVERTER STATUS FLAG | A3 | 3A | 602 |
FIG. 2
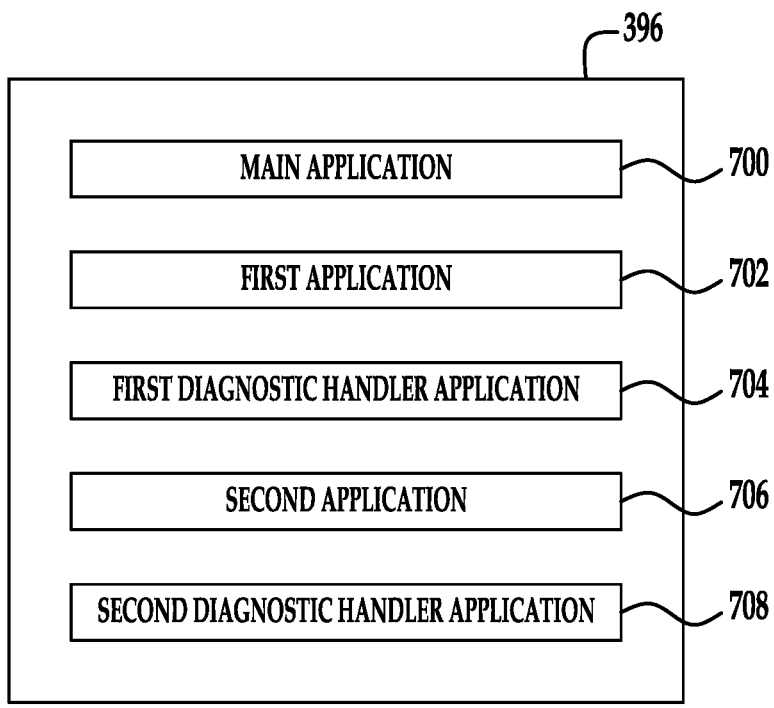
FIG. 3
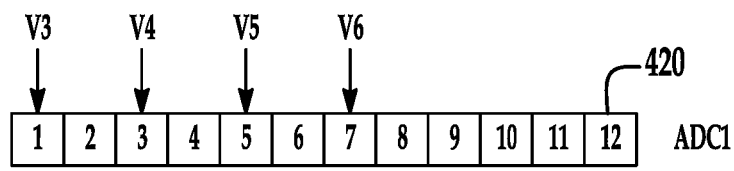
FIG. 4

DIAGNOSTIC SYSTEM FOR A VEHICLE ELECTRICAL SYSTEM HAVING FIRST AND SECOND VOLTAGE REGULATORS

CROSS-REFERENCE TO RELATED APPLICATION

This application claims priority to U.S. Provisional Patent Application No. 62/539,031 filed on Jul. 31, 2017, the entire contents of which are hereby incorporated by reference herein.

BACKGROUND

The inventor herein has recognized a need for an improved diagnostic system for a vehicle electrical system having first and second applications that each independently monitor corrected voltage values associated with both first and second voltage regulators to determine whether an analog-to-digital converter is operating as desired, and each independently take safe action if the analog-to-digital converter is malfunctioning.

SUMMARY

A diagnostic system for a vehicle electrical system having first and second voltage regulators outputting first and second voltages, respectively, in accordance with an exemplary embodiment is provided. The diagnostic system includes a microcontroller having an analog-to-digital converter, a first application, and a first diagnostic handler application. The diagnostic system further includes a first voltage divider circuit electrically coupled between the first voltage regulator and a first channel of the analog-to-digital converter, such that the first channel receives a third voltage from the first voltage divider circuit. The analog-to-digital converter measures the third voltage at a first time and generates a first voltage value based on the third voltage. The first application multiplies the first voltage value by a first correction value to obtain a first corrected voltage value. The first application sets a first analog-to-digital converter status flag equal to a first fault value when a difference between a first corrected voltage value and a second corrected voltage value is greater than a threshold difference value indicating that the analog-to-digital converter is malfunctioning. The first diagnostic handler application commanding a digital input-output device to generate control signals if the first analog-to-digital converter status flag is equal to the first fault value.

BRIEF DESCRIPTION OF THE DRAWINGS

FIG. 2 is a schematic of a table having non-fault values and fault values for first and second analog-to-digital converter status flags utilized by the diagnostic system of FIG. 1;

FIG. 3 is a block diagram of a main application, a first application, a first diagnostic handler application, a second application, and a second diagnostic handler application utilized by the diagnostic system of FIG. 1;

FIG. 4 is a schematic of channels of an analog-to-digital converter utilized in a microcontroller in the diagnostic system of FIG. 1;

DETAILED DESCRIPTION

Figure 1:
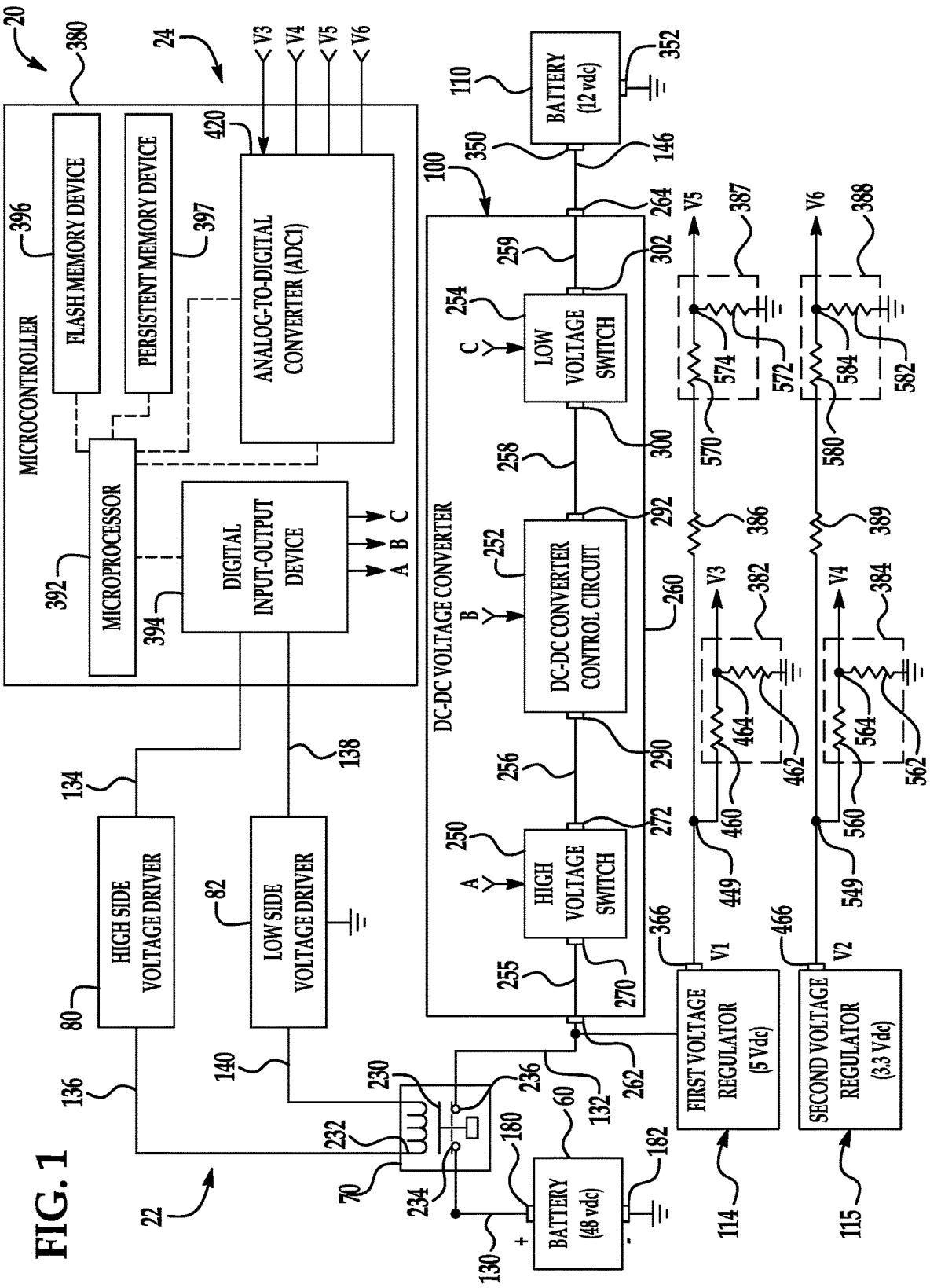
FIG. 1 is a schematic of a vehicle having a diagnostic system for a vehicle electrical system in accordance with an exemplary embodiment.

Referring to FIG. 1, a vehicle 20 is provided. The vehicle 20 includes a vehicle electrical system 22, and a diagnostic system 24 in accordance with an exemplary embodiment. The vehicle electrical system 22 includes a battery 60, a contactor 70, a high side voltage driver 80, a low side voltage driver 82, a DC-DC voltage converter 100, a battery 110, a first voltage regulator 114, and electrical lines 130, 132, 134, 136, 138, 140, 146.

Referring to FIGS. 1 and 3, an advantage of the diagnostic system 24 is that the system 24 utilizes first and second applications 702, 706 that each independently monitor corrected voltage values associated with the first and second voltage regulators 114, 115 to determine whether an analog-to-digital converter 420 is operating as desired, and each independently take safe action if the analog-to-digital converter 420 is malfunctioning.

For purposes of understanding, the term "node" or "electrical node" refers to a region or a location in an electrical circuit.

Also, for purposes of claim construction, the terms multiplying by a correction value (e.g., multiplying a number by 5) can also be equivalent to dividing by a correction value (e.g., dividing a number by 1/5).

The battery 60 includes a positive terminal 180 and a negative terminal 182. In an exemplary embodiment, the battery 60 generates substantially 48 Vdc between the positive terminal 180 and the negative terminal 182. The positive terminal 180 is electrically coupled to a node 234 of the contactor 70. The negative terminal 182 is electrically coupled to electrical ground.

The contactor 70 has a contact 230, a contactor coil 232, a first node 234, and a second node 236. The first node 234 is electrically coupled to the positive terminal 180 of the battery 60 utilizing the electrical line 130. The second node 236 is electrically coupled to the high voltage terminal 262 of the DC-DC voltage converter 100 utilizing the electrical line 132. When the digital input-output device 394 of the microcontroller 380 generates first and second control signals that are received by the high side voltage driver 80 and the low side voltage driver 82, respectively, the contactor coil 232 is energized which transitions the contact 230 to a closed operational state. Alternately, when the digital input-output device 394 of the microcontroller 380 generates third and fourth control signals that are received by the high side voltage driver 80 and the low side voltage driver 82, respectively, the contactor coil 232 is de-energized which transitions the contact 230 to an open operational state. In an exemplary embodiment, the third and fourth control signals can each be a ground voltage level.

The high side voltage driver 80 and the low side voltage driver 82 are provided to energize or de-energize the contactor coil 232.

The high side voltage driver 80 is electrically coupled to a digital input-output device 394 of the microcontroller 380 utilizing the electrical line 134. The high side voltage driver 80 is further electrically coupled to a first end of the contactor coil 232 utilizing the electrical line 136. The high side voltage driver 144 energizes the contactor coil 232, when the high side voltage driver 144 receives a control signal from the digital input-output device 394.

The low side voltage driver 82 is electrically coupled to the digital input-output device 394 of the microcontroller 380 utilizing the electrical line 138. The low side voltage driver 82 is further electrically coupled to a second end of the contactor coil 232 utilizing the electrical line 140. The low side voltage driver 82 is configured to conduct an electrical current therethrough to the electrical ground for energizing the contactor coil 232, when the low side voltage driver 82 receives a control signal from the digital input-output device 394.

The DC-DC voltage converter 100 includes a high voltage switch 250, a DC-DC converter control circuit 252, a low voltage switch 254, electrical lines 255, 256, 258, 259, a housing 260, a high voltage terminal 262, and a low voltage terminal 264. The housing 260 holds the high voltage switch 250, the DC-DC converter control circuit 252, and the low voltage switch 254 therein.

The high voltage switch 250 includes a first node 270 and a second node 272. The first node 270 is electrically coupled to the high voltage terminal 262 utilizing the electrical line 255, and the high voltage terminal 262 is further electrically coupled to the second node 236 of the contactor 70 utilizing the electrical line 132. The second node 272 is electrically coupled to a first node 290 of the DC-DC converter control circuit 252 utilizing the electrical line 256. In an exemplary embodiment, the high voltage switch 250 is a bi-directional MOSFET switch having desired voltage and current capabilities. When the microcontroller 380 generates a first control signal that is received by the high voltage switch 250 (or that is received by a controller or a microprocessor within the DC-DC voltage converter 100 that is operably coupled to the switch 250), the microcontroller 380 induces the switch 250 to transition to a closed operational state. When the microcontroller 380 generates a second control signal, the microcontroller 380 induces the switch 250 to transition to an open operational state. In an exemplary embodiment, the second control signal is a ground level control signal.

The DC-DC converter control circuit 252 has a first node 290 and a second node 292. The DC-DC converter control circuit 252 has internal FETs that are selectively switched to convert a DC voltage received at the first node 290 to another DC voltage output at the second node 292, based on control signals from the microcontroller 380. Alternately, the DC-DC converter control circuit 252 selectively switches the internal FETs to convert a DC voltage received at the second node 292 to another DC voltage that is output at the first node 290, based on control signals from the microcontroller 380.

The low voltage switch 254 includes a first node 300 and a second node 302. The first node 300 is electrically coupled to the second node 292 of the DC-DC converter control circuit 252 utilizing the electrical line 258. The second node 302 is electrically coupled to the low voltage terminal 264 utilizing the electrical line 259, and the low voltage terminal 264 is further electrically coupled to the battery 110 utilizing the electrical line 146. In an exemplary embodiment, the low voltage switch 254 has an identical structure as the high voltage switch 250. In an exemplary embodiment, the low voltage switch 254 is a bi-directional MOSFET switch having desired voltage and current capabilities. When the microcontroller 380 generates a first control signal that is received by the low voltage switch 254 (or that is received by a controller or a microprocessor within the DC-DC voltage converter 100 that is operably coupled to the switch 254), the microcontroller 380 induces the switch 254 to transition to a closed operational state. When the microcontroller 380 generates a second control signal, the microcontroller 380 induces the switch 254 to transition to an open operational state. In an exemplary embodiment, the second control signal is a ground level control signal.

The battery 110 includes a positive terminal 350 and a negative terminal 352. In an exemplary embodiment, the battery 110 generates substantially 12 Vdc between the positive terminal 350 and the negative terminal 352. The positive terminal 350 is electrically coupled to the low voltage terminal 264 of the DC-DC voltage converter 100. The negative terminal 352 is electrically coupled to an electrical ground, which may be electrically isolated from the electrical ground associated with the battery 60.

The first voltage regulator 114 has an output terminal 366 that outputs a voltage (e.g., 5 Vdc). The output terminal 366 is electrically coupled to a node 449 and to the resistor 386, and may be further electrically coupled to the microcontroller 380.

The second voltage regulator 115 has an output terminal 466 that outputs a voltage (e.g., 3.3 Vdc). The output terminal 466 is electrically coupled to a node 549 and to the resistor 389, and may be further electrically coupled to the microcontroller 380.

The diagnostic system 24 determines whether the analog-to-digital converter 420 is operating as desired, and if not the diagnostic system 24 takes a safe action of transitioning the contactor 70 to an open operational state, and transitioning the high voltage switch 250 and the low voltage switch 254 to an open operational state. The diagnostic system 24 includes a microcontroller 380, a first voltage divider circuit 382, a second voltage divider circuit 384, a resistor 386, a third voltage divider circuit 387, a fourth voltage divider circuit 388, and a resistor 389.

Referring to FIG. 1, the microcontroller 380 has a microprocessor 392, a digital input-output device 394, a flash memory device 396, a persistent memory device 397, and an analog-to-digital converter 420. The microcontroller 380 is programmed to monitor a voltages output by the first, second, third, fourth voltage divider circuits 382, 384, 387, 388 utilizing the analog-to-digital converter 420, and the microprocessor 392 which executes software applications stored in the flash memory device 396. The microprocessor 392 is operably coupled to the digital input-output device 394, the flash memory device 396, and the analog-to-digital converter 420. The digital input-output device 394 outputs digital control signals that are received by the voltage drivers 80, 82 for controlling the operation of the contactor 70. Referring to FIGS. 1 and 2, the persistent memory device 397 stores the table 600 therein which will be described in greater detail below.

The first voltage divider circuit 382 is provided to divide the first voltage (V1) that is output from the first voltage regulator 114, and to output a third voltage (V3) to the analog-to-digital converter 420. The first voltage divider circuit 382 includes resistors 460, 462. The resistor 460 is electrically coupled to and between the electrical node 449 and an electrical node 464 (and the analog-to-digital converter 420). Further, the resistor 462 is electrically coupled to and between the electrical node 464 and electrical ground. In an exemplary embodiment, the resistor 460 has a resistance of 2,000 ohms, and the resistor 462 has a resistance of 3,000 ohms. The analog-to-digital converter 420 measures the third voltage (V3) at the node 464 and generates a first voltage value based on the third voltage (V3).

The second voltage divider circuit 384 is provided to divide the second voltage (V2) that is output from the second voltage regulator 115, and to output a fourth voltage (V4) to the analog-to-digital converter 420. The second voltage divider circuit 384 includes resistors 560, 562. The resistor 560 is electrically coupled to and between the electrical node 549 and an electrical node 564 (and the analog-to-digital converter 420). Further, the resistor 562 is electrically coupled to and between the electrical node 564 and electrical ground. In an exemplary embodiment, the resistor 560 has a resistance of 1,000 ohms, and the resistor 562 has a resistance of 9,000 ohms. The analog-to-digital converter 420 measures the fourth voltage (V4) at the node 564 and generates a second voltage value based on the fourth voltage (V4).

The resistor 386 is electrically coupled to and between the output terminal 366 of the first voltage regulator 114 and the third voltage divider circuit 387. In an exemplary embodiment, the resistor 386 as a resistance of 1 mega-ohm.

The third voltage divider circuit 387 is provided to divide the voltage that is that is received from the resistor 386, and to output a fifth voltage (V5) to the analog-to-digital converter 420. The third voltage divider circuit 387 includes resistors 570, 572. The resistor 570 is electrically coupled to and between the resistor 386 and the electrical node 574 (and the analog-to-digital converter 420). Further, the resistor 572 is electrically coupled between the node 574 and electrical ground. In an exemplary embodiment, the resistor 570 has a resistance of 2,500 ohms, and the resistor 572 has a resistance of 2,500 ohms. The analog-to-digital converter 420 measures the fifth voltage (V5) at the node 574 and generates a third voltage value based on the fifth voltage (V5).

The resistor 389 is electrically coupled to and between the output terminal 466 of the second voltage regulator 115 and the fourth voltage divider circuit 388. In an exemplary embodiment, the resistor 386 as a resistance of 1 mega-ohm.

The fourth voltage divider circuit 388 is provided to divide the voltage that is that is received from the resistor 389, and to output a sixth voltage (V6) to the analog-to-digital converter 420. The fourth voltage divider circuit 388 includes resistors 580, 582. The resistor 580 is electrically coupled to and between the resistor 389 and the electrical node 584 (and the analog-to-digital converter 420). Further, the resistor 582 is electrically coupled between the node 584 and electrical ground. In an exemplary embodiment, the resistor 580 has a resistance of 800 ohms, and the resistor 582 has a resistance of 1,600 ohms. The analog-to-digital converter 420 measures the sixth voltage at the node 584 and generates a fourth voltage value based on the sixth voltage (V6).

Referring to FIGS. 1 and 2, a table 600 that is stored in the persistent memory device 397 and utilized by the microcontroller 380 is shown. The table 600 includes records 601, 602. The table 600 includes values that are utilized for setting the values of analog-to-digital converter status flags associated with the analog-to-digital converter 420. A status flag can either have a fault value indicating a fault operational condition or a non-fault value indicating a non-fault operational condition. In particular, the record 601 is associated with a first analog-to-digital converter status flag. The record 601 includes a non-fault value of "6C" hexadecimal, and a fault value of "C6" hexadecimal. Further, the record 602 is associated with a second analog-to-digital converter status flag. The record 602 includes a non-fault value of "A3" hexadecimal, and a fault value of "3A" hexadecimal.

The non-fault value and fault value in the record 601 have a Hamming distance of four from one another to eliminate memory overwrite errors associated with status flags utilizing the values. Further, the non-fault value and fault value in the record 602 have a Hamming distance of four from one another. Further, the non-fault value in the record 601 and the non-fault value in the record 602 have a Hamming distance of four for one another. Still further, the fault value in the record 601 and the fault value in the record 602 have a Hamming distance of four from one another.

Referring to FIGS. 1, 3 and 5-11, a method of operating the diagnostic system 24 will now be explained. The method utilizes a main application 700, a first application 702, a first diagnostic handler application 704, a second application 706, and a second diagnostic handler application 708.

Figure 5:
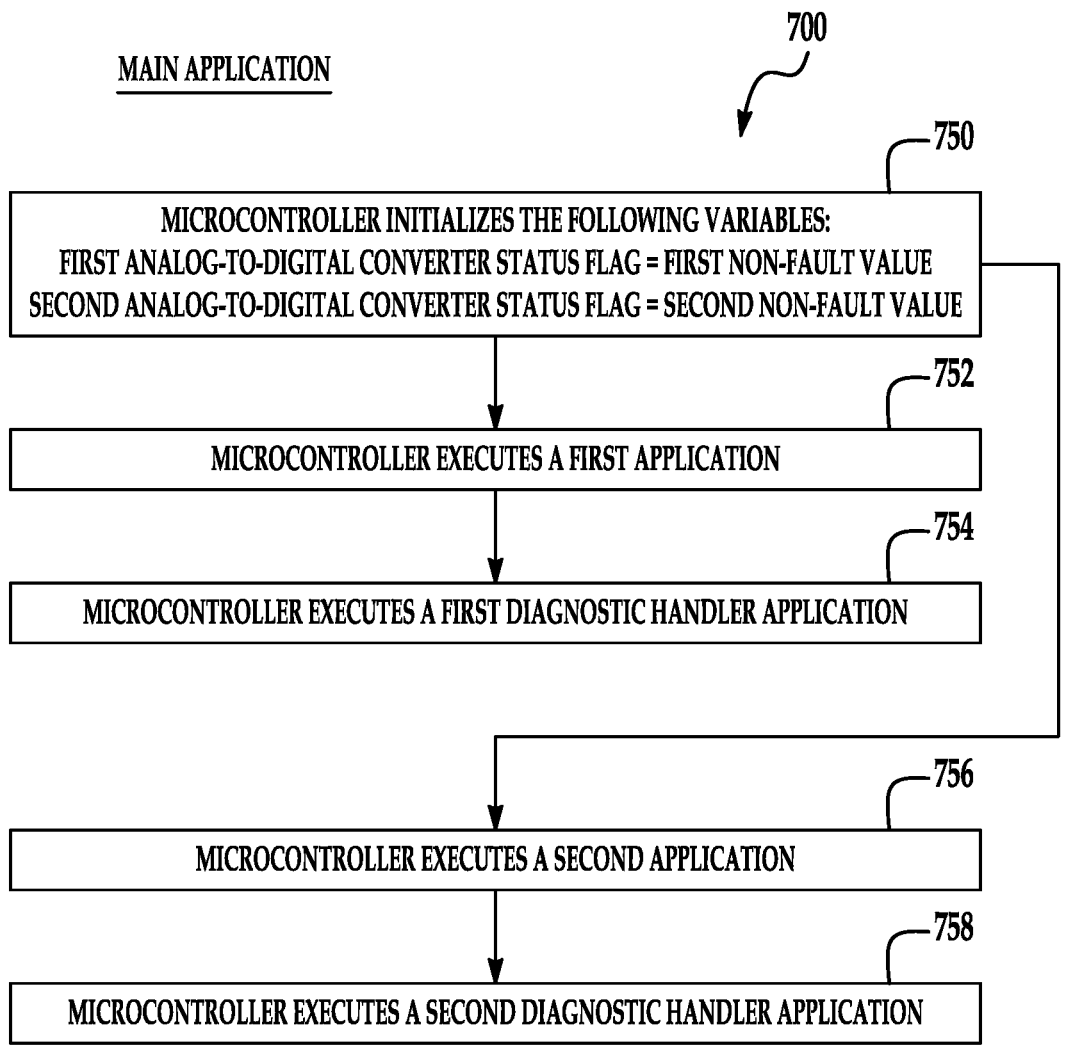
FIG. 5 is a flowchart of the main application of FIG. 3.

Referring to FIGS. 1 and 5, the main application 700 will now be explained.

At step 750, the microcontroller 380 initializes the following variables:

first analog-to-digital converter status flag=first non-fault value (e.g., 6C hexadecimal from record 601 in table 600 in FIG. 2);

second analog-to-digital converter status flag=second non-fault value (e.g., A3 hexadecimal from record 602 in table 600 in FIG. 2).

At step 752, the microcontroller 380 executes a first application 702.

At step 754, the microcontroller 380 executes a first diagnostic handler application 704.

At step 756, the microcontroller 380 executes a second application 706. It is noted that the first and second applications 702, 706 can be concurrently executed in first and second threads, respectively.

At step 758, the microcontroller 380 executes a second diagnostic handler application 708.

Figure 6:
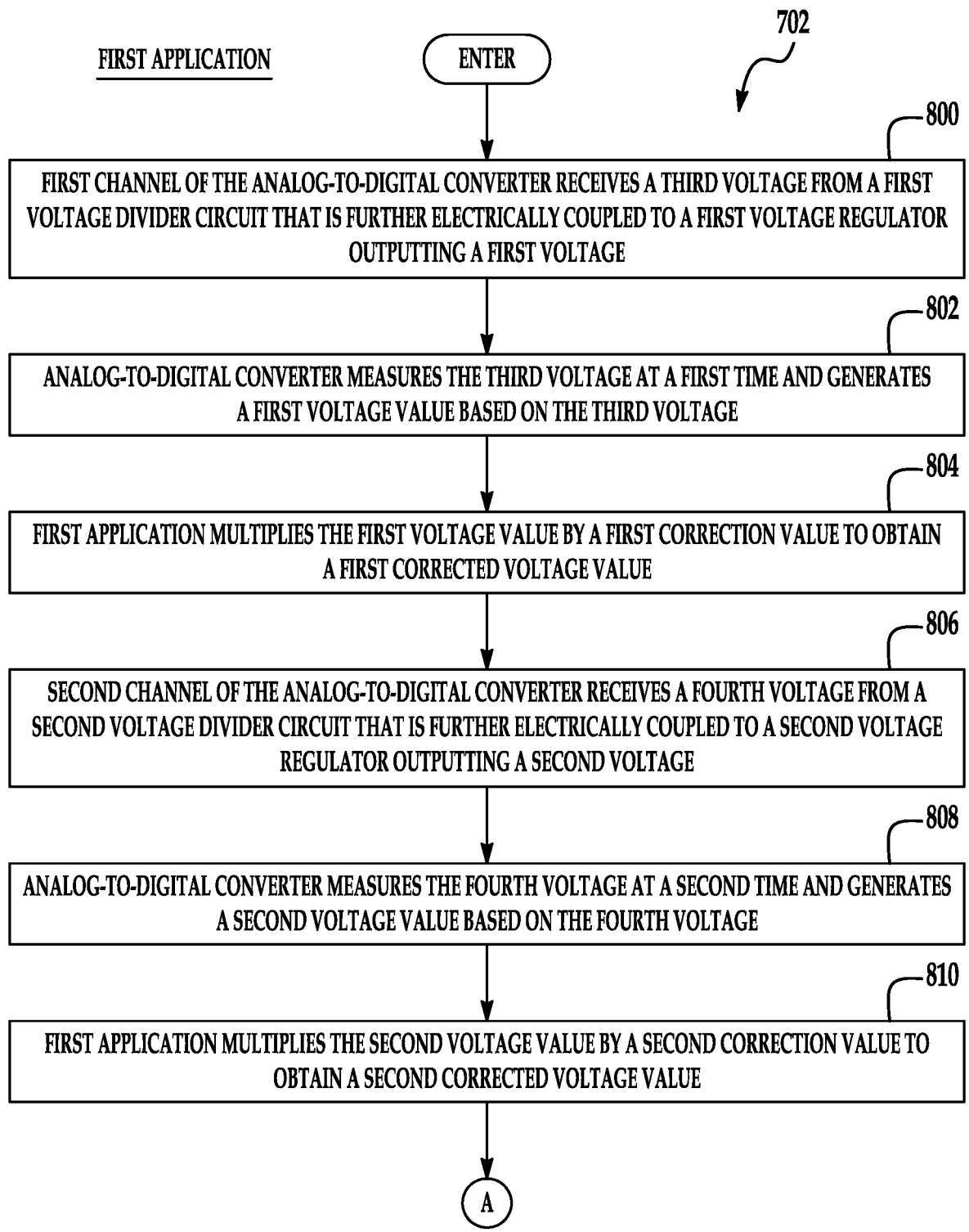
FIGS. 6 and 7 are flowcharts of the first application of FIG. 3.
Figure 7:
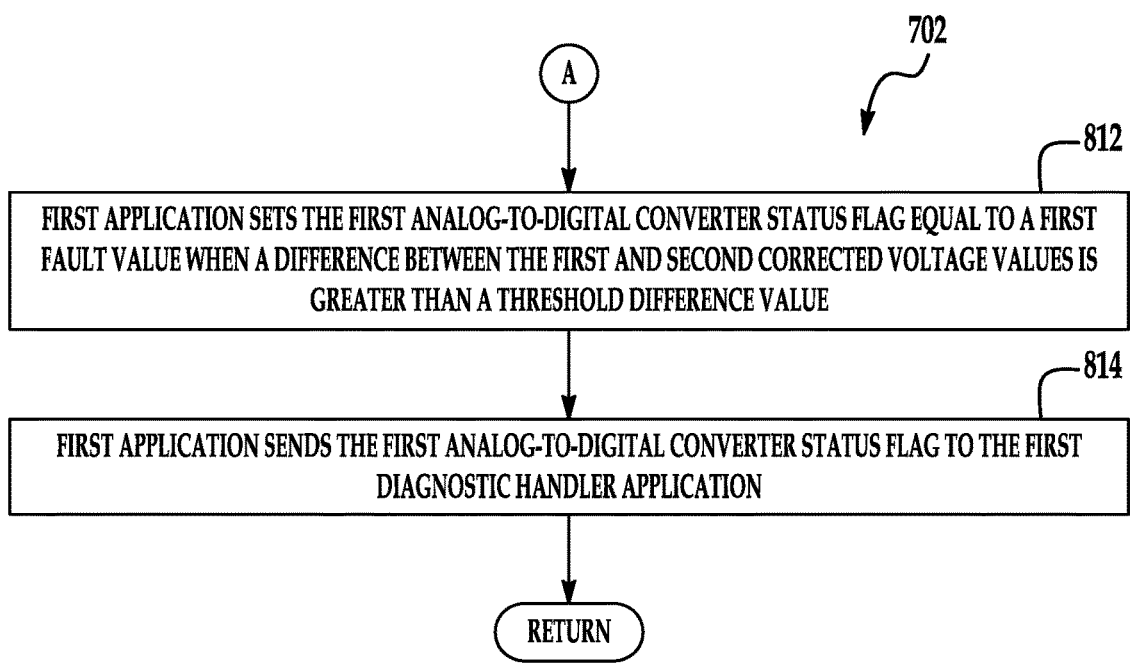

Referring to FIGS. 6 and 7, the first application 702 will now be explained.

At step 800, a first channel of the analog-to-digital converter 420 receives a third voltage (V3) from a first voltage divider circuit 382 that is further electrically coupled to a first voltage regulator 114 that outputs a first voltage (V1).

At step 802, the analog-to-digital converter 420 measures the third voltage (V3) at a first time and generates a first voltage value based on the third voltage (V3).

At step 804, the first application 702 multiplies the first voltage value by a first correction value to obtain a first corrected voltage value.

At step 806, the second channel of the analog-to-digital converter 420 receives a fourth voltage (V4) from a second voltage divider circuit 384 that is further electrically coupled to a second voltage regulator 115 that outputs a second voltage (V2).

At step 808, the analog-to-digital converter 420 measures the fourth voltage (V4) at a second time and generates a second voltage value based on the fourth voltage (V4).

At step 810, the first application 702 multiplies the second voltage value by a second correction value to obtain a second corrected voltage value.

At step 812, the first application 702 sets the first analog-to-digital converter status flag equal to a first fault value (e.g., C6 hexadecimal from record 601 in table 600 in FIG. 2) when a difference between the first and second corrected voltage values is greater than a threshold difference value.

At step 814, the first application 702 sends the first analog-to-digital converter status flag to the first diagnostic handler application 704. After step 814, the method returns to the main application 700.

Figure 8:
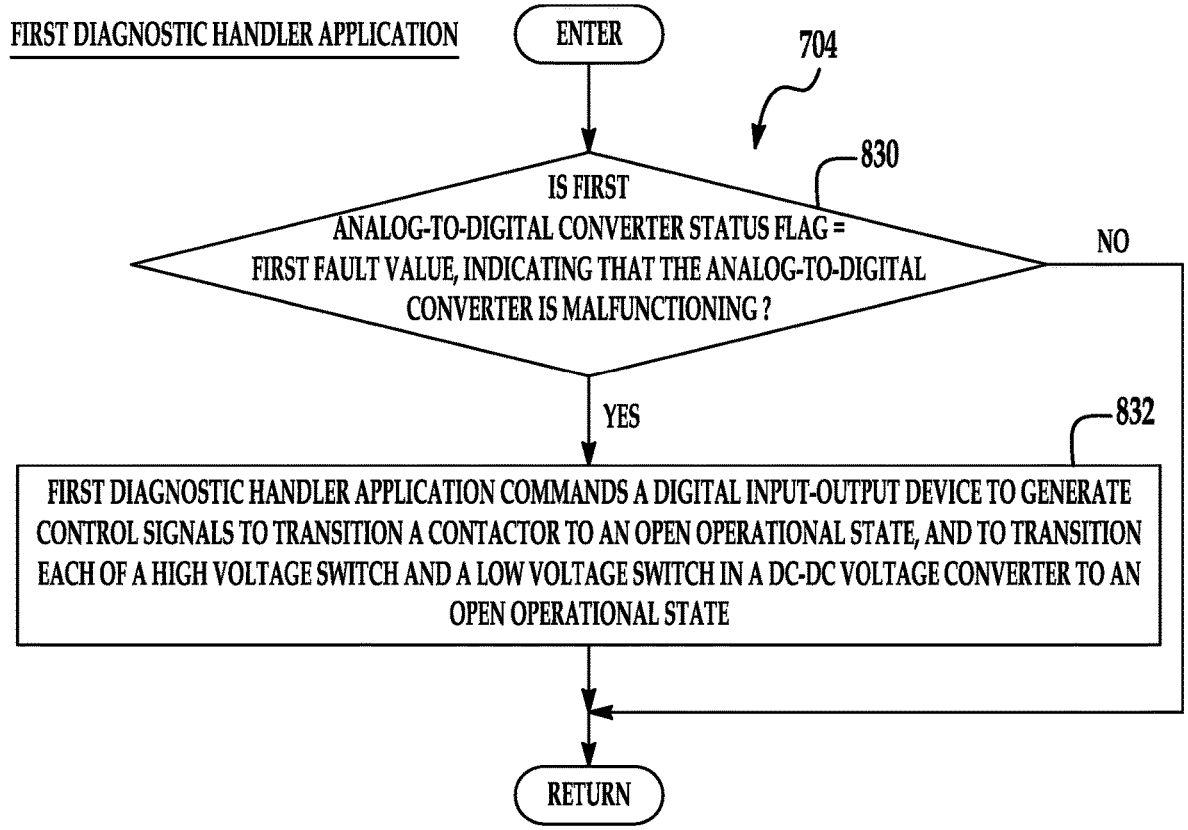
FIG. 8 is a flowchart of the first diagnostic handler application of FIG. 3.

Referring to FIG. 8, the first diagnostic handler application 704 will now be explained.

At step 830, the microcontroller 380 makes a determination as to whether the first analog-to-digital converter status flag is equal to the first fault value (e.g., C6 hexadecimal from record 601 in table 600 in FIG. 2), indicating that the analog-to-digital converter 420 is malfunctioning. If the value of step 830 equals "yes", the method advances to step 832. Otherwise, the method returns to the main application 700.

At step 832, the first diagnostic handler application 704 commands a digital input-output device 394 to generate control signals to transition a contactor 70 to an open operational state, and to transition each of a high voltage switch 250 and a low voltage switch 254 in a DC-DC voltage converter 100 to an open operational state. After step 832, the method returns to the main application 700.

Figure 9:
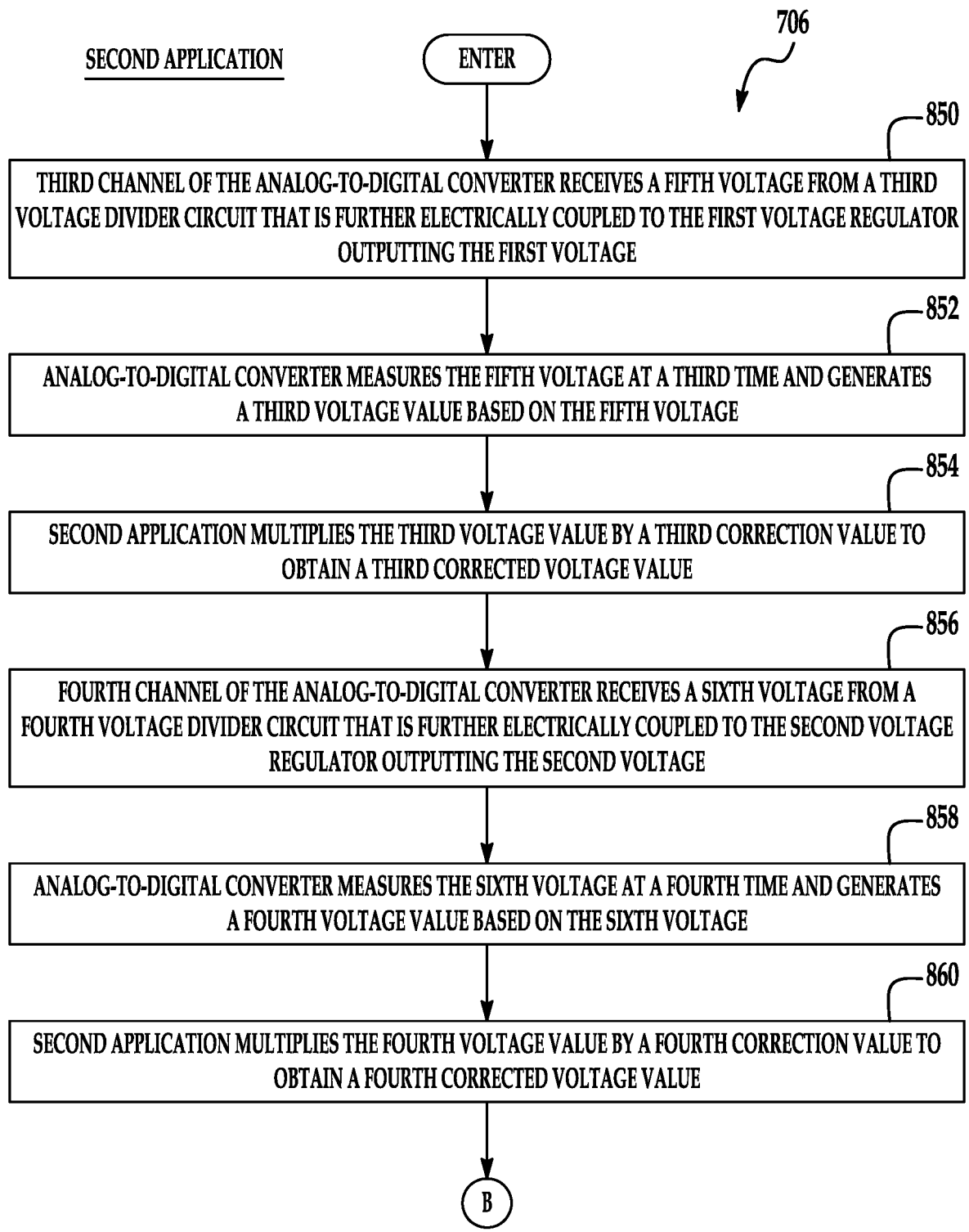
FIGS. 9 and 10 are flowcharts of the second application of FIG. 3.
Figure 10:
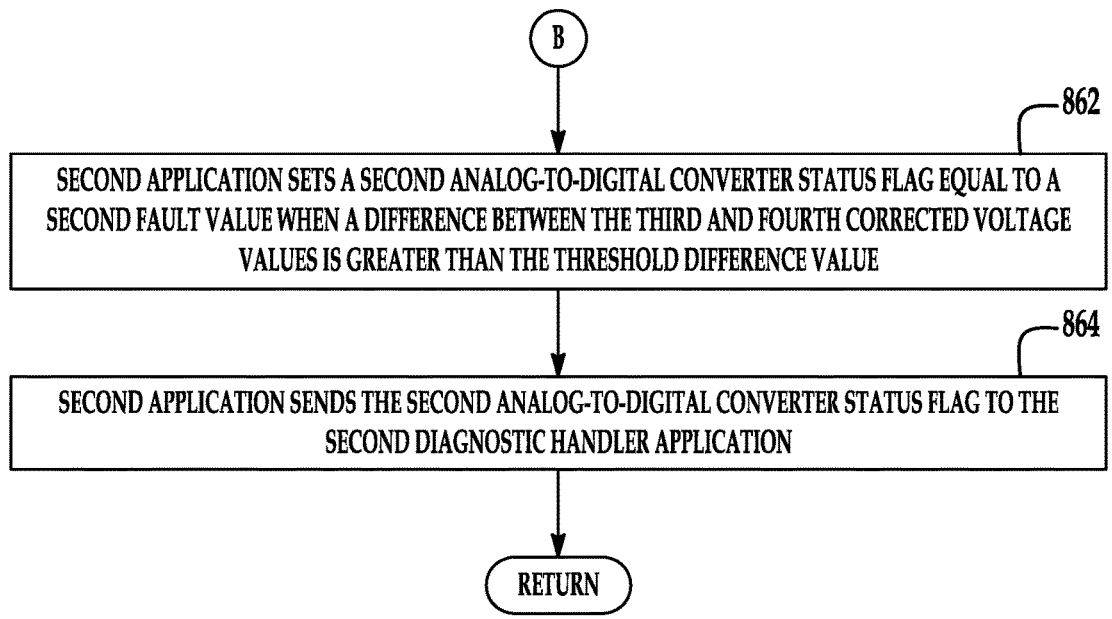

Referring to FIGS. 9 and 10, the second application 706 will now be explained.

At step 850, a third channel of the analog-to-digital converter 420 receives a fifth voltage (V5) from a third voltage divider circuit 387 that is further electrically coupled to the first voltage regulator 114 that outputs the first voltage (V1).

At step 852, the analog-to-digital converter 420 measures the fifth voltage (V5) at a third time and generates a third voltage value based on the fifth voltage (V5).

At step 854, the second application 706 multiplies the third voltage value by a third correction value to obtain a third corrected voltage value.

At step 856, a fourth channel of the analog-to-digital converter 420 receives a sixth voltage (V6) from a fourth voltage divider circuit 388 that is further electrically coupled to the second voltage regulator 115 that outputs the second voltage (V2).

At step 858, the analog-to-digital converter 420 measures the sixth voltage (V6) at a fourth time and generates a fourth voltage value based on the sixth voltage (V6).

At step 860, the second application 706 multiplies the fourth voltage value by a fourth correction value to obtain a fourth corrected voltage value.

At step 862, the second application 706 sets a second analog-to-digital converter status flag equal to a second fault value (e.g., 3A hexadecimal from record 602 in table 600 in FIG. 2) when a difference between the third and fourth corrected voltage values is greater than the threshold difference value.

At step 864, the second application 706 sends the second analog-to-digital converter status flag to the second diagnostic handler application 708. After step 864, the method returns to the main application 700.

Figure 11:
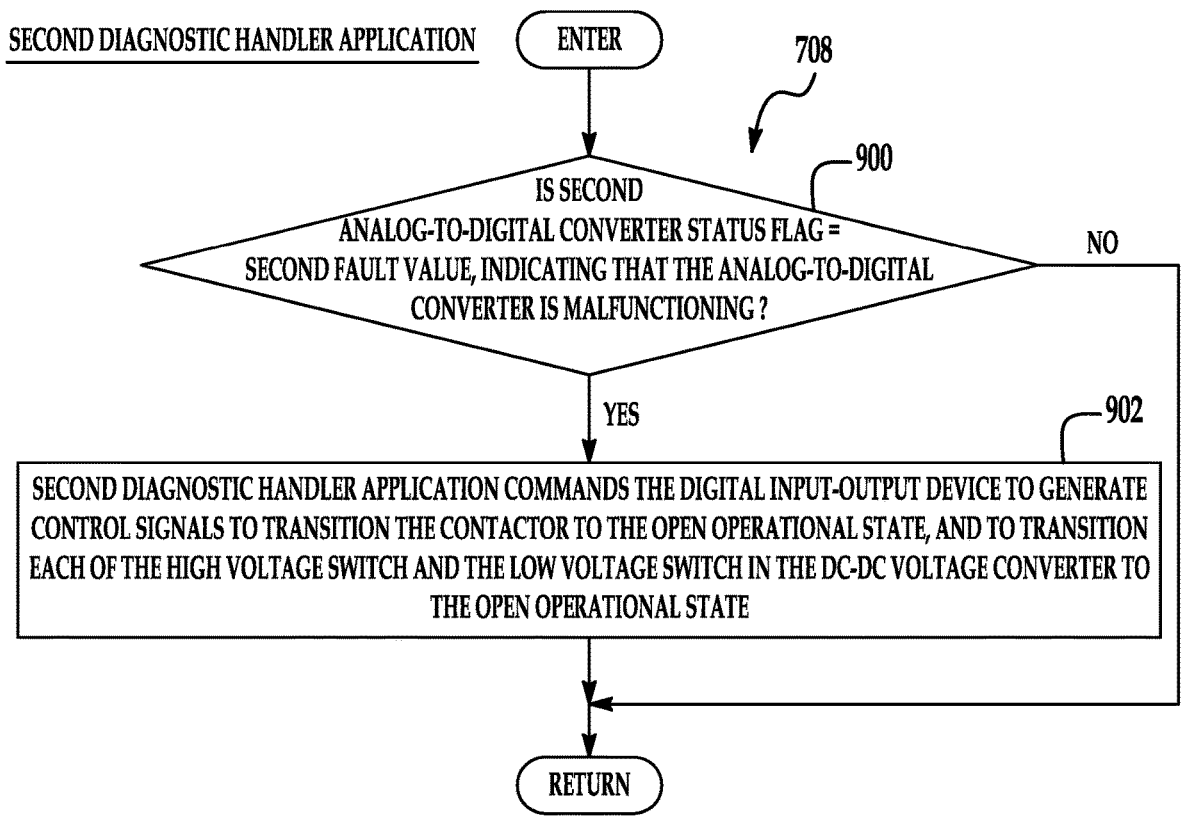
FIG. 11 is a flowchart of the second diagnostic handler application of FIG. 3.

Referring to FIG. 11, the second diagnostic handler application 708 will now be explained.

At step 900, the microcontroller 380 makes a determination as to whether the second analog-to-digital converter status flag is equal to the second fault value (e.g., 3A hexadecimal from record 602 in table 600 in FIG. 2), indicating that the analog-to-digital converter 420 is malfunctioning. If the value of step 900 equals "yes", the method advances to step 902. Otherwise, the method returns to the main application 700.

At step 902, the second diagnostic handler application 708 commands the digital input-output device 394 to generate control signals to transition the contactor 70 to the open operational state, and to transition each of the high voltage switch 250 and the low voltage switch 254 in a DC-DC voltage converter 100 to the open operational state. After step 902, the method returns to the main application 700.

The diagnostic system described herein for a vehicle electrical system provides a substantial advantage over other systems. In particular, the diagnostic system described herein utilizes first and second applications that each independently monitor corrected voltage values associated with the first and second voltage regulators to determine whether an analog-to-digital converter is operating as desired, and each independently take safe action if the analog-to-digital converter is malfunctioning.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A diagnostic system for a vehicle electrical system having first and second voltage regulators outputting first and second voltages, respectively, comprising:
   a microcontroller having an analog-to-digital converter, a first application, and a first diagnostic handler application;
   a first voltage divider circuit electrically coupled between the first voltage regulator and a first channel of the analog-to-digital converter, such that the first channel receives a third voltage from the first voltage divider circuit;
   the analog-to-digital converter measuring the third voltage at a first time and generating a first voltage value based on the third voltage;
   the first application multiplying the first voltage value by a first correction value to obtain a first corrected voltage value;
   a second voltage divider circuit electrically coupled between the second voltage regulator and a second channel of the analog-to-digital converter, such that the second channel receives a fourth voltage from the second voltage divider circuit;
   the analog-to-digital converter measuring the fourth voltage at a second time and generating a second voltage value based on the fourth voltage;
   the first application multiplying the second voltage value by a second correction value to obtain a second corrected voltage value;
   the first application setting a first analog-to-digital converter status flag equal to a first fault value when a difference between the first corrected voltage value and the second corrected voltage value is greater than a threshold difference value indicating that the analog-to-digital converter is malfunctioning; and
   the first diagnostic handler application commanding a digital input-output device to generate control signals if the first analog-to-digital converter status flag is equal to the first fault value.

2. The diagnostic system of claim 1, wherein the control signals generated by the digital input-output device transition a contactor to an open operational state.

3. The diagnostic system of claim 1, wherein the control signals generated by the digital input-output device transition each of a high voltage switch and a low voltage switch in a DC-DC voltage converter to an open operational state.

4. The diagnostic system of claim 1, wherein the microcontroller further includes a second application, the diagnostic system further comprising:
a first resistor coupled between the first voltage regulator and a third voltage divider circuit;
the third voltage divider circuit being further electrically coupled to a third channel of the analog-to-digital converter such that the analog-to-digital converter receives a fifth voltage from the third voltage divider circuit;
the analog-to-digital converter measuring the fifth voltage at a third time and generating a third voltage value based on the fifth voltage;
the second application multiplying the third voltage value by a third correction value to obtain a third corrected voltage value;
the second application setting a second analog-to-digital converter status flag equal to a second fault value when a difference between the third corrected voltage value and a fourth corrected voltage value is greater than the threshold difference value indicating that the analog-to-digital converter is malfunctioning; and
the second diagnostic handler application commanding the digital input-output device to generate control signals if the second analog-to-digital converter status flag is equal to the second fault value.

5. The diagnostic system of claim 4, further comprising:
a second resistor coupled between the second voltage regulator and a fourth voltage divider circuit;
the fourth voltage divider circuit being further electrically coupled to a fourth channel of the analog-to-digital converter such that the analog-to-digital converter receives a sixth voltage from the fourth voltage divider circuit;
the analog-to-digital converter measuring the sixth voltage at a fourth time and generating a fourth voltage value based on the sixth voltage; and
the second application multiplying the fourth voltage value by a fourth correction value to obtain the fourth corrected voltage value.

6. The diagnostic system of claim 4, wherein the control signals generated by the digital input-output device transition a contactor to an open operational state.

7. The diagnostic system of claim 4, wherein the control signals generated by the digital input-output device transition each of a high voltage switch and a low voltage switch in a DC-DC voltage converter to an open operational state.

8. The diagnostic system of claim 4, wherein the first and second fault values have a Hamming distance of four from one another.

9. A diagnostic system for a vehicle electrical system having first and second voltage regulators outputting first and second voltages, respectively, comprising:

a microcontroller having an analog-to-digital converter, a first application, a second application, a first diagnostic handler application, and a second diagnostic handler application;
a first voltage divider circuit electrically coupled between the first voltage regulator and a first channel of the analog-to-digital converter, such that the first channel receives a third voltage from the first voltage divider circuit;
the analog-to-digital converter measuring the third voltage at a first time and generating a first voltage value based on the third voltage;
the first application multiplying the first voltage value by a first correction value to obtain a first corrected voltage value;
the first application setting a first analog-to-digital converter status flag equal to a first fault value when a difference between the first corrected voltage value and a second corrected voltage value is greater than a threshold difference value indicating that the analog-to-digital converter is malfunctioning;
the first diagnostic handler application commanding a digital input-output device to generate control signals if the first analog-to-digital converter status flag is equal to the first fault value;
a first resistor coupled between the first voltage regulator and a second voltage divider circuit;
the second voltage divider circuit being further electrically coupled to a second channel of the analog-to-digital converter such that the analog-to-digital converter receives a fourth voltage from the second voltage divider circuit;
the analog-to-digital converter measuring the fourth voltage at a second time and generating a second voltage value based on the fourth voltage;
the second application multiplying the fourth voltage value by a second correction value to obtain a third corrected voltage value;
the second application setting a second analog-to-digital converter status flag equal to a second fault value when a difference between the third corrected voltage value and a fourth corrected voltage value is greater than the threshold difference value indicating that the analog-to-digital converter is malfunctioning; and
the second diagnostic handler application commanding the digital input-output device to generate control signals if the second analog-to-digital converter status flag is equal to the second fault value.

10. The diagnostic system of claim 9, wherein the control signals generated by the digital input-output device transition a contactor to an open operational state.

11. The diagnostic system of claim 9, wherein the control signals generated by the digital input-output device transition each of a high voltage switch and a low voltage switch in a DC-DC voltage converter to an open operational state.

12. The diagnostic system of claim 9, wherein the first and second fault values have a Hamming distance of four from one another.

* * * * *